United States Patent [19]

Prevot et al.

[11] 4,258,328
[45] Mar. 24, 1981

[54] FEED FORWARD MICROWAVE AMPLIFIER FOR COMMUNICATION SYSTEMS

[75] Inventors: Julien Prevot; Jean-Claude Raux, both of Paris, France

[73] Assignee: Societe Lignes Telegraphiques et Telephoniques, Honorine, France

[21] Appl. No.: 16,381

[22] Filed: Mar. 1, 1979

[30] Foreign Application Priority Data

Mar. 3, 1978 [FR] France .................... 78 06093

[51] Int. Cl.³ ........................ H03F 1/32; H03F 3/68
[52] U.S. Cl. .................................. 330/149; 330/151; 330/295
[58] Field of Search ............... 330/124 R, 149, 151, 330/295

[56] References Cited

U.S. PATENT DOCUMENTS

| | | | |
|---|---|---|---|
| 3,541,467 | 11/1970 | Seidel | 330/149 X |
| 4,068,186 | 1/1978 | Sato et al. | 330/151 X |

OTHER PUBLICATIONS

Hsieh et al., "A Feedforward S-Band MIC Amplifier System", *IEEE Journal of Solid-State Circuits*, vol. SC-11, No. 2, Apr. 1976, pp. 271–278.

*Primary Examiner*—James B. Mullins
*Attorney, Agent, or Firm*—Kemon & Estabrook

[57] ABSTRACT

A microwave wide band feed forward amplifier consists of modular amplifying units and modular delay units adjusted to compensate said modular amplifying unit, two said amplifying units constitute the main amplifier, another two the error signal amplifier and a single module amplifier is connected between the input and the error signal amplifier. Wide band compensation of the 3rd harmonic level is obtained at high level.

3 Claims, 8 Drawing Figures

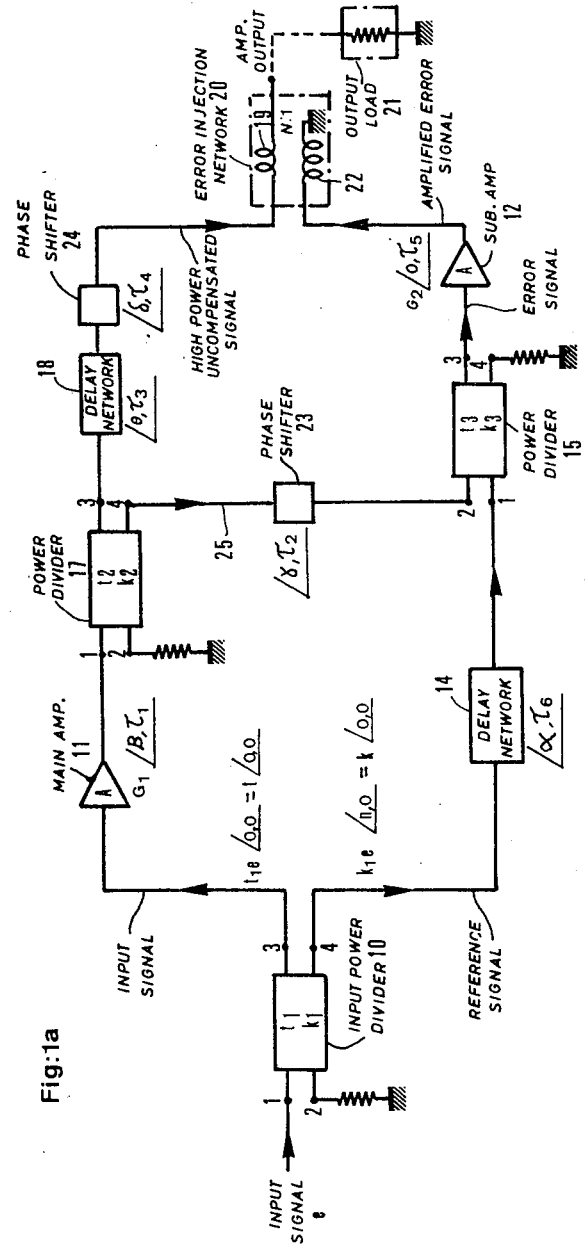
Fig:1a
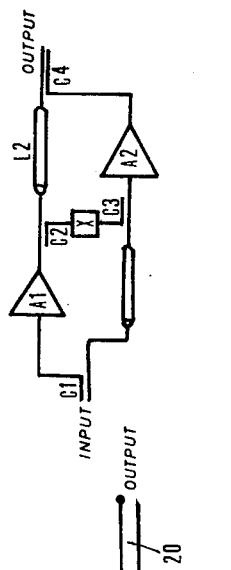
Fig:1b
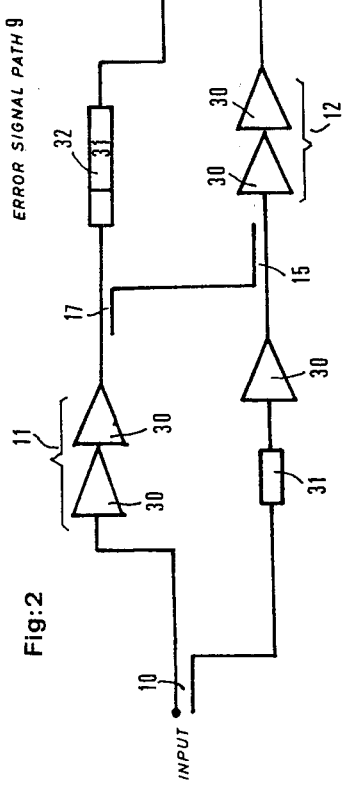
Fig:2

FEED FORWARD MICROWAVE AMPLIFIER FOR COMMUNICATION SYSTEMS

BACKGROUND OF THE INVENTION

The present invention concerns microwave amplifiers intended for communication systems having a low harmonic distortion ratio when delivering an output power close to the maximum power.

In communications, the allowed level of intermodulation is 50 dB below the level of the information signal. Therefore the ratio between the output power and the maximum power of the amplifiers is at present limited to a very low value, for example one-tenth, in order to avoid intermodulation which could not thereafter be eliminated by means of conventional filters. In order to increase this ratio, it is known to use feedforward control.

In the following, the intermodulation due to the harmonics, the greater part of which is due to the 3rd harmonic, will be called "distortion".

U.S. Pat. 3,471,798, applied for on Dec. 26, 1967 by Bell Telephone Laboratories discloses a feed forward amplifier. FIG. 1a, reproduces FIG. 1 of this patent, shows three directional couplers (power dividers) 10, 17 and 15 as well as an error injection network 20, two elemental amplifiers 11 and 12, two delay compensating network 14 and 18 and two further adjustable phase shifters 23 and 24. The operation of the circuit is fully explained in the specification FIG. 1b showing a very similar circuit is the FIG. 1 of the article entitled "A wideband feedforward amplifier" which appeared in the December 1974, issue of "IEEE Journal of Solid-State Circuit", volume SC-9, No. 6, pages 422 to 428. This second low-distortion amplification circuit differs from the first by the presence of an attenuator between the couplers $C_2$ and $C_3$ and by the omission of the phase shifter 24.

BRIEF SUMMARY OF THE INVENTION

The object of the present invention is to provide a low-distortion amplifier for microwave communication systems which is built with a plurality of identical wideband amplification modules and a plurality of phase-shifting or delay identical modules which exactly balances the phase shift in the band of the amplification module.

The feed forward wideband amplifier for microwave communication systems according to the invention is made of 5 identical wideband amplifying modules respectively a two-module main amplifier, a two-module (error) amplifier and a one-module amplifier to feed the error signal amplifier and two delay networks comprising the same adjusted module.

The feed-forward amplification circuit according to the invention had the following advantages:

the introduction of a third amplifier, in the error signal path of which the gain is equal to one-half of that of the main amplifier, makes it possible to reduce the error signal at the input of the error signal amplifier, due to the variation of the gain in the band of the main amplifier, in a proportion of 50% as compared with that of the circuit according to the prior art and makes the balance possible over a larger bandwidth in the microwave range;

the elemental circuits which it comprises being made from amplification modules, the delay introduced is a multiple of that of the amplification module and compensation may be obtained by a modular delay circuit.

BRIEF DESCRIPTION OF THE DRAWINGS

FIGS. 1a and 1b show diagrams of prior art circuits.

Figure 3:
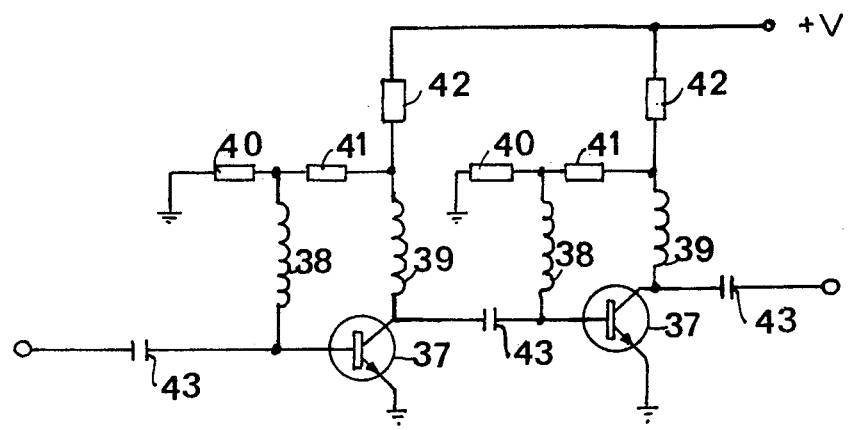
Figure 4:
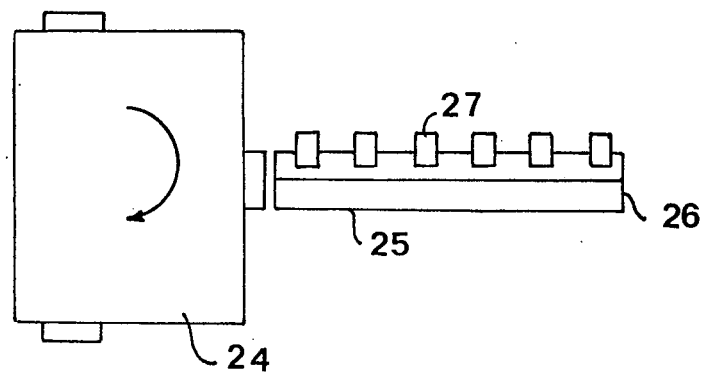
Figure 5:
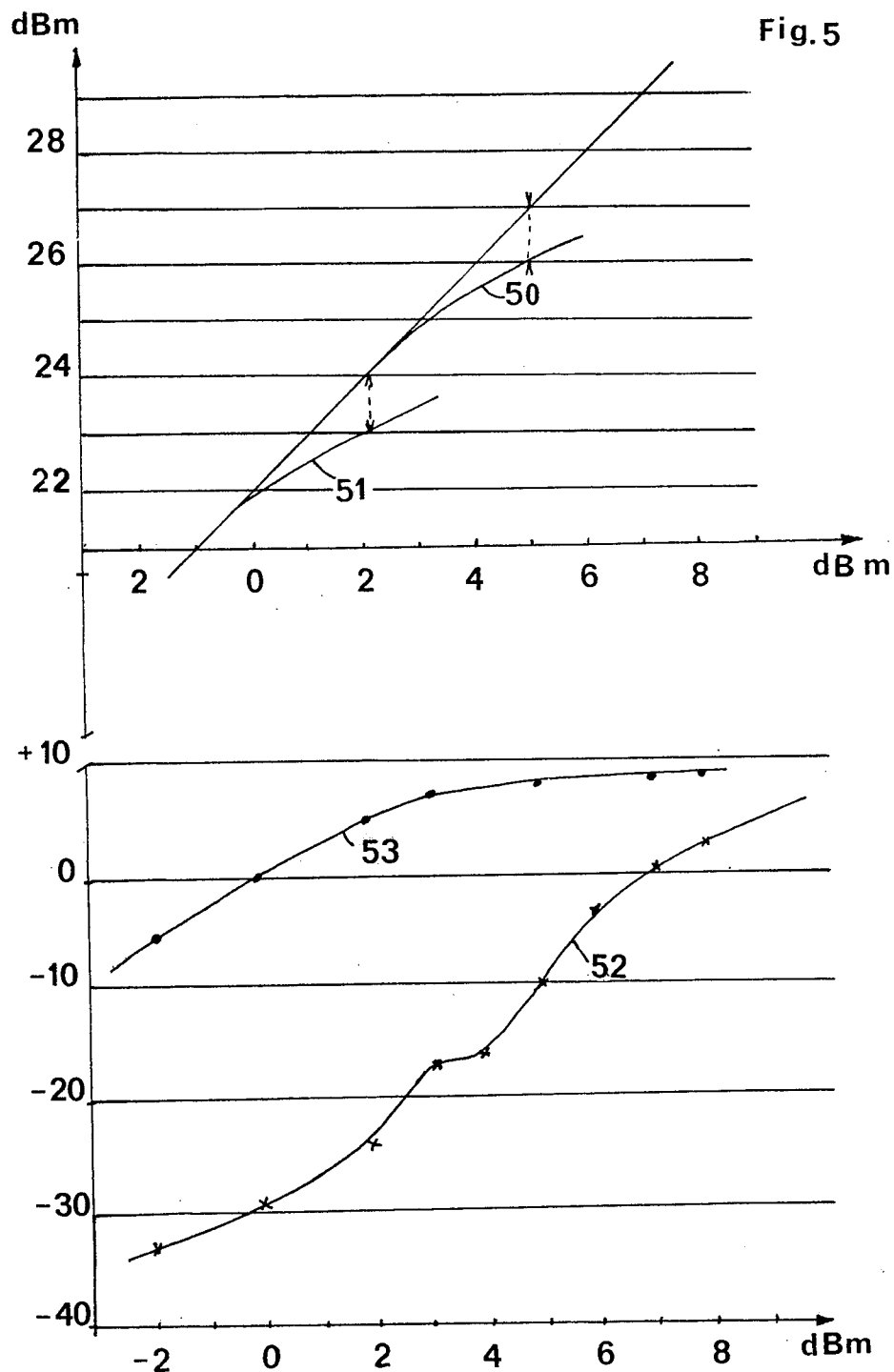
Figure 6:
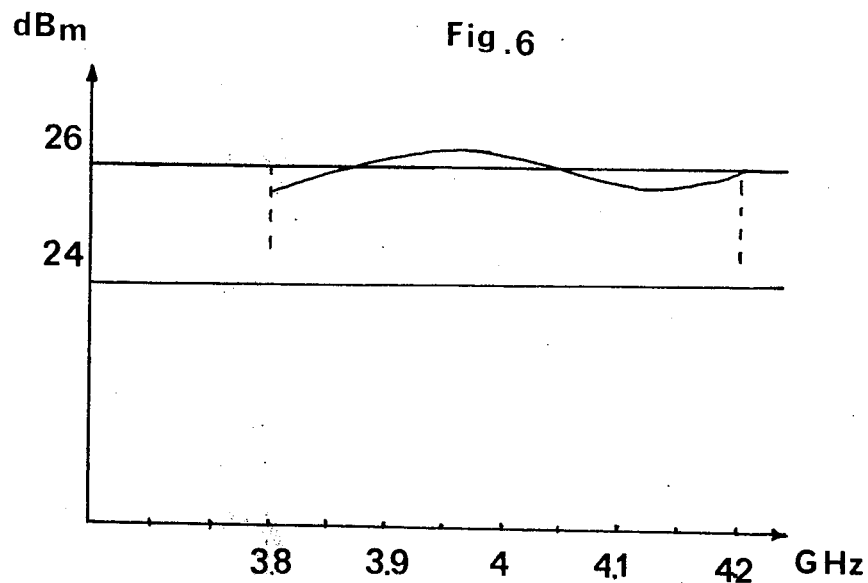
Figure 7:
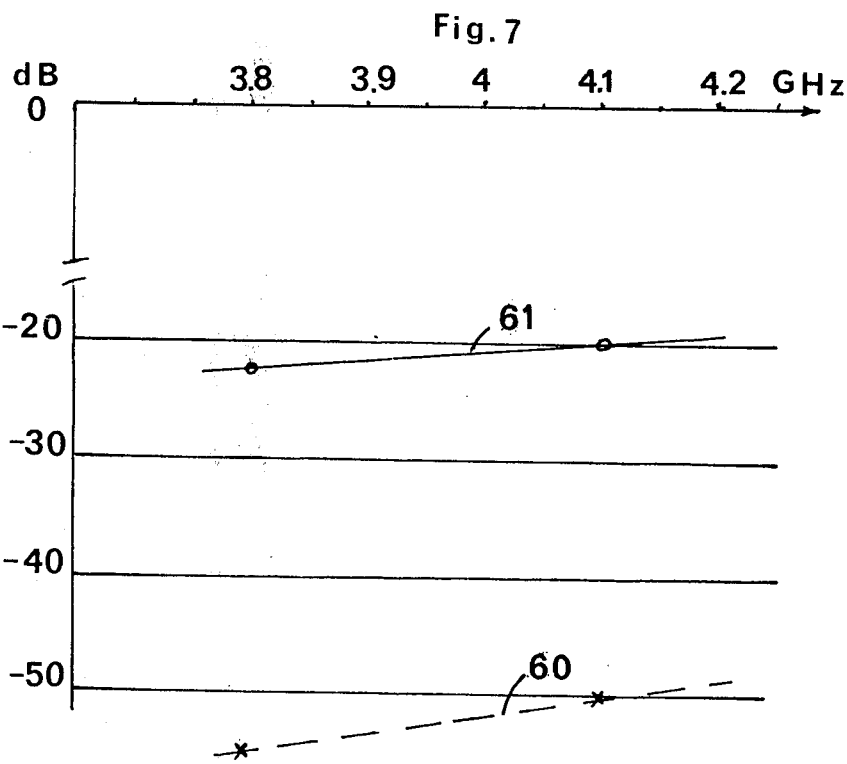

The invention is now described with reference to FIGS. 2 and 7, which are given by way of illustration and have no limiting character, and in which:

FIG. 2 is the diagram of the low-distortion amplification circuit according to the invention, FIG. 3 is the diagram of the amplification module, FIG. 4 illustrates the phase shifting module, FIG. 5 is the curve representing the output level of the low-distortion amplification circuit, FIG. 6 is the curve representing the variation of the output level in the pass band, and FIG. 7 is the curve illustrating the variation of the intermodulation level of order 3 as a function of the frequency.

DETAILED DESCRIPTION OF THE INVENTION

In order to make it easier to read, references in FIG. 2 are identical with references in FIG. 1a for the same circuit. The circuit in FIG. 2 comprises two identical directional couplers (power dividers) 10 and 20, which are different from identical directional couplers (power dividers) 17 and 15. Each elemental amplifier 11 and 12 consists of two identical amplification modules 30. The first loop comprises in addition a third amplifier consisting of a single module 30, of which the output is connected to the forward input of directional coupler (power divider) 15. A delay circuiting circuit 31 connected to the attenuated output of power divider 10 and to the input of the amplification module 30 compensates for the phase shift introduced by one amplification module 30. In the second loop, a delay circuit 32 compensates for the phase shift introduced by error amplifier 12 (two modules). Let the condition for the cancellation of the information signal at the input of the error signal amplifier 12 be satisfied at low level and let the level of the input signal of the low-distortion amplification circuit gradually raise, an error signal appears at the input of 12. This error signal will consist more particularly of two voltages at frequency $2F_2-F_1$ and $2F_1-F_2$, and then $3F_2-2F_1$ and $3F_1-2F_2$, and so on, resulting from the beating of two frequencies $F_1$ and $F_2$ of the information signal for which the maximum input level of the main amplifier 11 is substantially reached. The error amplifier 12 brings the level of the error signal to the level permitting exact correction at the output of power divider 20 taking into account the attenuations due to dividers 15, 17 and 20 and delay circuit 32.

By way of illustration, a feed-forward amplifier operating in the frequency band 3.8–4.2 GHz has been designed having a gain variation of less than ± 0.5 dB in the band. This circuit comprises two amplifiers 11 and 12 each consisting of two amplification modules 30 having a gain equal to 13 dB.

FIG. 3 is the circuit diagram of an amplification module 30. The two transistors 37 indicated in this diagram are of the type marketed by the French Company "Radiotechnique Compelec" under reference LJE42004T. These transistors provided with a type Fo41 socket are connected with their emitter earthed and operate in class A. Their maximum output level at 1 dB gain compression is equal to 25 dBm and the gain is 7 dB at 4.2 GHz. The inductors 38 and 39 are formed as microstrips deposited on the printed circuit serving as a substrate for resistors 40, 41 and 42, and for the connecting capacitors 43. Power dividers 10 and 20 designed in strip-line technology have a direct loss factor equal to 1.5 dB and an attenuation factor equal to 6 dB. Power dividers 17 and 15 produced by the same technology have a direct loss factor equal to 0.5 dB and an attenuation factor in the neighbourhood of 10 dB.

FIG. 4 illustrates the modular delay circuit 31 consisting of 3-port circulator 24 (type R2943, marketed by Lignes Télégraphiques et Téléphoniques-Paris), and of strip-line stub 25 terminated by a short-circuiting plunger 26 with six matching screws 27. The delay circuit 32 comprises an additional coaxial line section connected in series with the circulator.

FIG. 5 illustrates the output level of the above amplifier as a function of the input level. Curve 50 shows that an output level equal to + 26 dBm is obtained with a compression of 1 dB. Curve 51 is the same curve of a two amplification modules amplifier without feed forward. It shows compression equal to 1 dB at the level + 23 dBm. Curves 52 and 53 show respectively the intermodulation level of order three of the low-distortion amplification circuit and that of the two-module amplifier without feed forward.

FIG. 6 illustrates the variation of the output level in the pass band of the amplifier circuit just described.

FIG. 7 shows as curve 60 the intermodulation curve of order three of the amplifier circuit just described, plotted for an output level of + 25 dBm and as curve 61 the intermodulation curve of order three of a two-module amplifier without feed forward, at an output level of + 22 dBm.

What we claim:

1. A feed forward microwave wide band amplifier comprising:
   a first power divider having an information signal input and a pair of outputs one of which is attenuated;
   a second power divider having a forward input and a pair of outputs one of which is attenuated;
   a first amplifier connected between the unattenuated output of said first divider and the input of said second divider;
   a third power divider having a pair of inputs and an output;
   a first delay circuit having its input connected to the attenuated output of said first power divider;
   a second amplifier connected between the output of said first delay circuit and one of the inputs of said third power divider;
   means connecting the attenuated output of said second power divider to the other input of said third power divider;
   an output power divider having a pair of inputs and an amplified output;
   a second delay circuit connected between other output of said second power divider and one of the inputs of said output power divider; and
   a third amplifier connected between the output of said third power divider and the other input of said output power divider; said second amplifier being a one amplification module and the delay of said first delay circuit being equal to the delay of the information signal introduced by said second amplifier, said first and third amplifiers each comprising two serially connected amplification modules, each identical to said first module.

2. A feed forward microwave wide band amplifier as claimed in claim 1 wherein each said amplification module is a two-stage transistorized circuit.

3. A feed forward microwave wide band amplifier as claimed in claim 1 wherein said first and second delay circuits both comprise a three port-circulator with an adjusted strip-line section connected to one port, the other two ports being respectively the input and the output of the delay circuit.

* * * * *